(12) United States Patent
Yoshinari et al.

(10) Patent No.: US 8,420,280 B2
(45) Date of Patent: *Apr. 16, 2013

(54) HOLOGRAM RECORDING MEDIUM

(75) Inventors: Jiro Yoshinari, Tokyo (JP); Atsuko Kosuda, Tokyo (JP); Naoki Hayashida, Tokyo (JP)

(73) Assignee: TDK Corporation, Tokyo (JP)

(*) Notice: Subject to any disclaimer, the term of this patent is extended or adjusted under 35 U.S.C. 154(b) by 949 days.

This patent is subject to a terminal disclaimer.

(21) Appl. No.: 11/847,819

(22) Filed: Aug. 30, 2007

(65) Prior Publication Data

US 2008/0057405 A1    Mar. 6, 2008

(30) Foreign Application Priority Data

Sep. 1, 2006    (JP) .................................. 2006-238364

(51) Int. Cl.
    *G03H 1/02*    (2006.01)
(52) U.S. Cl.
    USPC ............. 430/1; 430/2; 430/281.1; 430/280.1; 359/3
(58) Field of Classification Search ........................ None
    See application file for complete search history.

(56) References Cited

U.S. PATENT DOCUMENTS

| | | | |
|---|---|---|---|
| 4,187,111 A * | 2/1980 | Chandross et al. ............... | 430/2 |
| 6,268,089 B1 | 7/2001 | Chandross et al. | |
| 6,479,193 B1 | 11/2002 | Maeda et al. | |
| 6,524,771 B2 | 2/2003 | Maeda et al. | |
| 7,169,375 B2 * | 1/2007 | Chisholm ................... | 423/592.1 |
| 7,883,821 B2 | 2/2011 | Kosuda et al. | |
| 7,932,000 B2 | 4/2011 | Hayashida et al. | |
| 7,939,221 B2 | 5/2011 | Kosuda et al. | |
| 2002/0110740 A1 | 8/2002 | Otaki et al. | |
| 2005/0068593 A1 * | 3/2005 | Hayase et al. ..................... | 359/1 |
| 2006/0056036 A1 * | 3/2006 | Suzuki et al. .................. | 359/642 |
| 2006/0172203 A1 * | 8/2006 | Mizushima ........................ | 430/1 |
| 2007/0095736 A1 * | 5/2007 | Malik et al. ................. | 210/198.2 |
| 2007/0111107 A1 | 5/2007 | Yoshinari et al. | |

(Continued)

FOREIGN PATENT DOCUMENTS

| | | |
|---|---|---|
| JP | 6-148880 | 5/1994 |
| JP | 8-337438 | 12/1996 |

(Continued)

OTHER PUBLICATIONS

Lou et al. "Anhydrous sol-gel synthesis of titania-doped siloxane polymer for integrated optics" J. Sol-Gel Sci & Technol. vol. 32 pp. 297-301 (2004).*

(Continued)

*Primary Examiner* — Martin Angebranndt
(74) *Attorney, Agent, or Firm* — Oblon, Spivak, McClelland, Maier & Neustadt, L.L.P.

(57) ABSTRACT

The present invention provides a hologram recording medium which can attain high refractive index change, flexibility, high sensitivity, low scattering, environment resistance, durability, low dimension change (low shrinkage) and high multiplicity in holographic memory record using a blue laser. A hologram recording medium (11) comprising at least a hologram recording material layer, wherein the hologram recording material layer (21) comprises at least a metal oxide and a photopolymerizable compound; and said hologram recording medium has a light transmittance of 50% or more at a wavelength of 405 nm, or a light reflectance of 25% or more at a wavelength of 405 nm.

20 Claims, 3 Drawing Sheets

U.S. PATENT DOCUMENTS

| | | | |
|---|---|---|---|
| 2007/0111108 A1 | 5/2007 | Hayashida et al. | |
| 2007/0243474 A1* | 10/2007 | Mizushima et al. | 430/2 |
| 2008/0057404 A1* | 3/2008 | Kosuda et al. | 430/2 |
| 2008/0057406 A1* | 3/2008 | Hayashida et al. | 430/2 |
| 2008/0076033 A1* | 3/2008 | Hayashida et al. | 430/2 |
| 2008/0145307 A1* | 6/2008 | Kosuda et al. | 423/608 |
| 2008/0160421 A1* | 7/2008 | Hayashida et al. | 430/2 |
| 2008/0193857 A1* | 8/2008 | Kosuda et al. | 430/2 |
| 2008/0254375 A1* | 10/2008 | Hayashida et al. | 430/2 |
| 2008/0268349 A1* | 10/2008 | Kosuda et al. | 430/2 |
| 2009/0091810 A1* | 4/2009 | Yoshinari et al. | 359/3 |
| 2009/0092904 A1* | 4/2009 | Hayashida et al. | 430/2 |
| 2009/0097085 A1* | 4/2009 | Hayashida et al. | 359/3 |
| 2009/0163683 A1* | 6/2009 | Kim et al. | 526/261 |
| 2009/0186281 A1* | 7/2009 | Kosuda et al. | 430/2 |
| 2010/0086859 A1 | 4/2010 | Hayashida et al. | |
| 2011/0287343 A1 | 11/2011 | Hayashida et al. | |

FOREIGN PATENT DOCUMENTS

| | | | |
|---|---|---|---|
| JP | 2953200 | | 7/1999 |
| JP | 11-344917 | | 12/1999 |
| JP | 2002-236439 | | 8/2002 |
| JP | 2002-236440 | | 8/2002 |
| JP | 2003-43903 | | 2/2003 |
| JP | 2005-55636 | | 3/2005 |
| JP | 2005-110708 | | 4/2005 |
| JP | 2005-321674 | | 11/2005 |
| WO | 01/31401 | * | 5/2001 |
| WO | WO 2005/109115 A1 | | 11/2005 |
| WO | WO 2005/109116 A1 | | 11/2005 |

OTHER PUBLICATIONS

Ciba IRGACURE 369 Datasheet 3 pages (2001).*
Segawa et al. "Fabrication of photonic crystal structures by femptosecond laser induced . . . " J. Sol-Gel Sci & Technol. vol. 26 pp. 1023-1027 (2003).*
Ciba IRGACURE 907 Datasheet 3 pages (2001).*
Park et al. "Photoinduced condensation of sol-gel hybrid glass films doped with benzildimethylketal", J. Mater. Res. vol. 16(17) pp. 2143-2148 (Jul. 2001).*
Ciba IRGACURE 651 Datasheet 3 pages (2001).*
Kintaka et al. "Diffraction gratings of photosensitive ZrO2 gel films . . . " Appl. Opt. vol. 39(4) pp. 489-493 (Feb. 2000).*
Ayras et al. "Multilevel features in sol-gel thin films with . . . " Thin. Sol. Films., vol. 352 pp. 9-12 (1999).*
Suzuki et al. "Holographic recording in TiO2 nanoparticle-dispersed methacrylate photopolymer films" Appl. Phys. Lett., vol. 81(22) pp. 4121-4123 (Nov. 2002).*
Suzuki et al. "Highly transparent ZrO2 nanodispersed acrylate photopolymers for volume holographic recording", Opt. Exp. vol. 14(26) pp. 12712 12719 (Dec. 2006).*
Sanchez et al. TiO2 nanoparticles photopolymer composites for volume holographic recording, Adv. Funct. Mater., vol. 15 1623-1629 (2005).*
Zhan et al. "A catalyst free approach for sol-gel synthese of highly mixed ZrO2-SiO2 oxides", J. non-cryst. Sol. vol. 243 pp. 26-38 (1999).*
Nacken et al. "formation and hydrolytic stability of oxygen bridged heterometal bonds (Si-O-Ti, Si-O-Zr,Si-O-Ta) in sol-gel materials" Mat. Res. Soc. Symp. Proc. 576 pp. 221-226 (1999).*
Hoebbel et al. "NMR and IR spectroscopic examination of the hydrolytic stabili8ty . . . " Mat. Res. Sco. Symp. Proc 435 pp. 461-467 (1996).*
Julian et al."Synthesis and charachterization of transdlarent PDMS-Metal-OXo based . . . " Chem. Mater., vol. 15(15) pp. 3026-3034 (Jun. 2003).*
Wojcik et al., "Organic-inorganic gels based on silica and multifunctional acrylates", J. Sol-gel Sci. Technol., vol. 2, pp. 115-120 (1994).*
Glebov et al., "photorefraction in proous xerogel-photopolymer composite materials". Sov. Tech. Phys. Lett., vol. 16(6) pp. 445-446 (Jun. 1990).*
"Photoinitiators for UV curing, Key products selection guide 2003" 8 pages (2003).*
U.S. Appl. No. 11/953,325, filed Dec. 10, 2007, Kosuda, et al.
U.S. Appl. No. 11/964,464, filed Dec. 26, 2007, Hayashida, et al.
U.S. Appl. No. 12/021,686, filed Jan. 29, 2008, Kosuda, et al.
U.S. Appl. No. 12/356,979, filed Jan. 21, 2009, Kosuda, et al.
U.S. Appl. No. 12/061,971, Apr. 3, 2008, Hayashida, et al.
U.S. Appl. No. 12/109,000, filed Apr. 24, 2008, Kosuda, et al.
U.S. Appl. No. 11/579,821, filed Nov. 7, 2006, Tetsuro Mizushima, et al.
U.S. Appl. No. 11/579,536, filed Nov. 3, 2006, Tetsuro Mizushima, et al.
T. Shimura, "Holographic Memory", O plus E, vol. 25, No. 4, 2003, pp. 385-390.
U.S. Appl. No. 11/847,831, filed Aug. 30, 2007, Hayashida, et al.
U.S. Appl. No. 11/847,730, Aug. 30, 2007, Kosuda, et al.
U.S. Appl. No. 11/859,992, Sep. 24, 2007, Hayashida, et al.
U.S. Appl. No. 12/556,965, filed Sep. 10, 2009, Hayashida, et al.
U.S. Appl. No. 12/236,123, filed Sep. 23, 2008, Yoshinari, et al.
U.S. Appl. No. 12/243,077, Oct. 1, 2008, Hayashida, et al.
U.S. Appl. No. 12/235,958, filed Sep. 23, 2008, Hayashida, et al.
Office Action mailed Nov. 16, 2010, in Japanese Patent Application No. 2006-238364, filed Sep. 1, 2006.

* cited by examiner

HOLOGRAM RECORDING MEDIUM

BACKGROUND OF THE INVENTION

1. Field of the Invention

The present invention relates to a hologram recording medium having a hologram recording material layer suitable for volume hologram record. The present invention relates in particular to a hologram recording medium having a hologram recording material layer suitable for record/reproduction using a blue laser light.

2. Disclosure of the Related Art

Research and development of holographic memories have been advanced as large-capacity recording technique making high-speed transmission possible. O plus E, vol. 25, No. 4, 385-390 (2003) describes basic structures of holographic memories and a coming prospect thereof.

Examples of the property required for a hologram recording material include high refractive index change at the time of recording, high sensitivity, low scattering, environment resistance, durability, low dimensional change, and high multiplicity. About holographic memory record using a green laser, various reports have been made hitherto as follows.

As a hologram recording material, there is known a photopolymer material made mainly of an organic binder polymer and a photopolymerizable monomer. However, the photopolymer material has problems about environment resistance, durability and others. In order to solve the problems of the photopolymer material, attention has been paid to an organic-inorganic hybrid material made mainly of an inorganic matrix and a photopolymerizable monomer, and the hybrid material has been investigated. The inorganic matrix is excellent in environment resistance and durability.

For example, Japanese Patent No. 2953200 discloses a film for optical recording wherein a photopolymerizable monomer or oligomer and a photopolymerization initiator are contained in an inorganic substance network film. It is also disclosed that the brittleness of the inorganic network film is improved by modifying the inorganic network organically. However, the compatibility between the inorganic substance network and the photopolymerizable monomer or oligomer is bad. Therefore, a uniform film is not easily obtained. A specific disclosure of the publication is that a photosensitive layer having a thickness of about 10 μm (par. [0058]) is exposed to an argon laser having a wavelength of 514.5 nm (par. [0059]).

JP-A-11-344917 discloses an optical recording medium wherein an organic-inorganic hybrid matrix contains an optically active monomer. In the organic-inorganic hybrid matrix, a metal element has an alkyl group (a methyl group) or an aryl group (a phenyl group). However, the introduction of the methyl group makes it impossible to improve the compatibility between the hybrid matrix and the optically active monomer. The introduction of the phenyl group gives a more improvement in the compatibility than the introduction of the methyl group. However, the introduction of the phenyl group causes a fall in the curing speed of a hybrid matrix precursor ([0015] in the above publication). A specific disclosure of the publication is that record is made in a hologram recording layer having a thickness of 100 μm, using a YAG laser having a wavelength of 532 nm (Example, [0031]).

JP-A-2002-236439 discloses a hologram recording material comprising: a matrix made of an organic-inorganic hybrid polymer obtained by copolymerizing an organometallic compound containing an ethylenically unsaturated double bond and an organic monomer having an ethylenically unsaturated double bond, as main chain constituting components, and/or a hydrolyzed polycondensate thereof; a photopolymerizable compound; and a photopolymerization initiator. By the introduction of the large organic main chain component into the matrix material, the compatibility between the matrix and the photopolymerizable compound is improved. However, the introduction of the large organic main chain component permits the presence of a two-component structure of the organic main chain and an inorganic network in the matrix material. Thus, it appears that the matrix may not exhibit unified behavior at the time of recording so as to cause nonuniform recording. If the ratio of the organic main chain component in the matrix is large, the same problems as in the case of the above-mentioned photopolymer material, which uses an organic binder polymer, are caused. A specific disclosure of the publication is that a hologram recording material layer having a thickness of 20 μm (par. [0080]) is exposed to an argon laser having a wavelength of 514.5 nm (par. [0081]).

In order to solve the problems of the hologram recording materials disclosed in the above-mentioned individual publications, JP-A-2005-321674 discloses a hologram recording material comprising: an organometallic compound at least containing at least two kinds of metals (Si and Ti), oxygen, and an aromatic group, and having an organometallic unit wherein two aromatic groups are directly bonded to one metal (Si); and a photopolymerizable compound. In Example 1 of the publication (in particular, pars. [0074] to [0078]), it is disclosed that a hologram recording medium which has a layer of the above-mentioned hologram recording material having a thickness of 100 μm gave a high transmittance, a high refractive index change, a low scattering, and a high multiplicity in record using a Nd:YAG laser (532 nm).

SUMMARY OF THE INVENTION

Any of the above-mentioned publications disclose holographic memory record using a green laser, but do not disclose holographic memory record using a blue laser.

An object of the present invention is to provide a hologram recording medium suitable for holographic memory record using a blue laser. More specifically, an object of the present invention is to provide a hologram recording medium which has a hologram recording material layer suitable for volume hologram record and can attain high refractive index change, flexibility, high sensitivity, low scattering, environment resistance, durability, low dimensional change (low shrinkage) and high multiplicity in holographic memory record using a blue laser.

The present inventors have made investigations, so as to find out that when a blue laser is used to make a holographic memory record in the hologram recording medium disclosed in JP-A-2005-321674, the transmittance thereof falls so that good holographic memory recording characteristics cannot be obtained. When a transmittance falls, holograms (interference fringes) are unevenly formed in the recording layer along the thickness direction of the recording layer so that scattering-based noises and the like are generated. It has been found out that in order to obtain good hologram image characteristics, it is necessary that the medium has a light transmittance of 50% or more.

A light transmittance of a hologram recording layer depends on a thickness thereof. As the thickness of the recording layer is made smaller, the light transmittance is improved; however, the widths of diffraction peaks obtained when reproducing light is irradiated into a recorded pattern become larger so that separability between adjacent diffraction peaks deteriorates. Accordingly, in order to obtain a sufficient SN ratio, it is indispensable to make a shift interval (an angle or the like) large when multiple record is made. For this reason, a high multiplicity cannot be attained. In the use of a hologram recording medium in any recording system, the thickness of its recording layer is required to be at lowest 100 μm in order to attain holographic memory recording characteristics for ensuring a high multiplicity.

The present invention includes the followings:

(1) A hologram recording medium comprising at least a hologram recording material layer,
  wherein the hologram recording material layer comprises at least a metal oxide and a photopolymerizable compound; and
  said hologram recording medium has a light transmittance of 50% or more at a wavelength of 405 nm, or a light reflectance of 25% or more at a wavelength of 405 nm.

(2) The hologram recording medium according to the above-described (1), wherein the hologram recording material layer further comprises a photopolymerization initiator.

(3) The hologram recording medium according to the above-described (1) or (2), wherein the hologram recording material layer has a thickness of at least 100 μm.

(4) The hologram recording medium according to any one of the above-described (1) to (3), wherein the metal oxide comprises, as metals, Si and at least one selected from the group consisting of Ta and Zr, wherein a complexing ligand is coordinated to Ta and/or Zr.

In the present specification, a complexing ligand is a ligand which is capable of forming a complex with a metal by coordination.

(5) The hologram recording medium according to any one of the above-described (1) to (4), wherein the complexing ligand is selected from the group consisting of β-dicarbonyl compounds, polyhydroxylated ligands, and α- or β-hydroxy acids.

(6) The hologram recording medium according to any one of the above-described (1) to (5), wherein the metal oxide has an organometallic unit in which two aromatic groups are directly bonded to Si.

(7) The hologram recording medium according to any one of the above-described (1) to (6), wherein record/reproduction of said hologram recording medium are made using a laser light having a wavelength of 350 to 450 nm.

The hologram recording medium of the present invention has a hologram recording material layer containing at least a photopolymerizable compound and a metal oxide functioning as a matrix or a dispersing medium for the photopolymerizable compound, and has a light transmittance of 50% or more at a wavelength of 405 nm or a light reflectance of 25% or more at a wavelength of 405 nm. Thus, in holographic memory record using a blue laser, good holographic memory recording characteristics can be obtained without lowering the light transmittances of the recording material layer nor the medium.

DETAILED DESCRIPTION OF THE INVENTION

Figure 1:
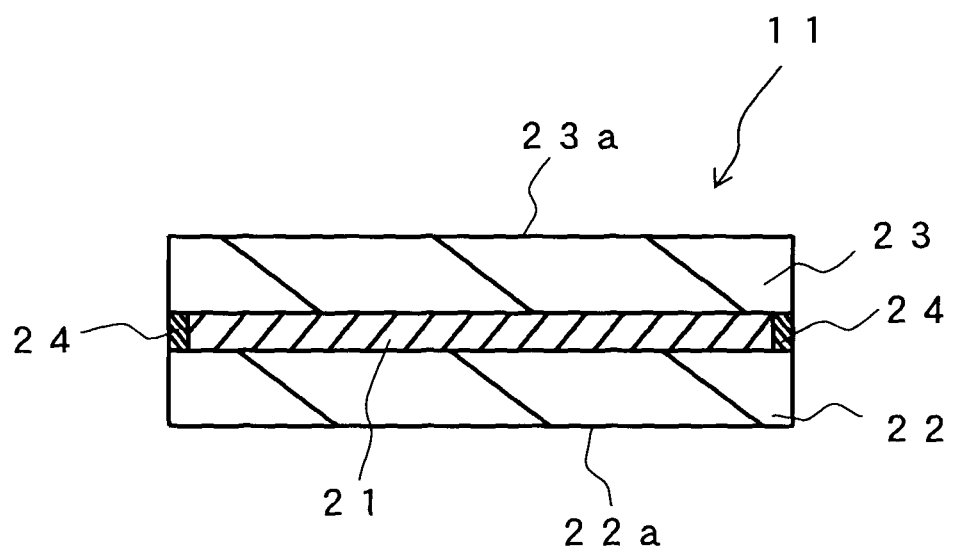
FIG. 1 is a view illustrating a schematic cross section of a hologram recording medium produced in the example.

The hologram recording medium of the present invention comprises at least a hologram recording material layer. Usually, a hologram recording medium comprises a supporting substrate (i.e., a substrate) and a hologram recording material layer; however, a hologram recording medium may be made only of a hologram recording material layer without having any supporting substrate. For example, a medium composed only of a hologram recording material layer may be obtained by forming the hologram recording material layer onto the substrate by application, and then peeling the hologram recording material layer off from the substrate.

The hologram recording medium of the present invention has a light transmittance of 50% or more at a wavelength of 405 nm, or has a light reflectance of 25% or more at a wavelength of 405 nm. In other words, in the case of performing reproduction using transmitted light, the hologram recording medium of the present invention has a light transmittance of 50% or more at a wavelength of 405 nm, and in the case of performing reproduction using reflected light, the hologram recording medium of the present invention has a light reflectance of 25% or more at a wavelength of 405 nm.

The hologram recording medium is either of a medium having a structure for performing reproduction using transmitted light (hereinafter referred to as a transmitted light reproducing type medium), and a medium having a structure for performing reproduction using reflected light (hereinafter referred to as a reflected light reproducing type medium) in accordance with an optical system used for the medium.

The transmitted light reproducing type medium is constructed in such a manner that a laser light for readout is irradiated into the medium, the laser light irradiated therein is diffracted by signals recorded in its hologram recording material layer, and the laser light transmitted through the medium is converted to electric signals by means of an image sensor. In other words, in the transmitted light reproducing type medium, the laser light to be detected is transmitted through the medium toward the medium side opposite to the medium side into which the reproducing laser light is irradiated. The transmitted light reproducing type medium usually has a structure wherein its recording material layer is sandwiched between two supporting substrates. In an optical system used for the medium, the image sensor, for detecting the transmitted laser light, is set up in the medium side opposite to the medium side into which the reproducing laser light emitted from a light source is irradiated.

Accordingly, in the transmitted light reproducing type medium, the supporting substrate, the recording material layer, and any other optional layer(s) are each made of a light-transmitting material. It is unallowable that any element blocking the transmission of the reproducing laser light is substantially present. The supporting substrate is usually a rigid substrate made of glass or resin.

In the meantime, the reflected light reproducing type medium is constructed in such a manner that a laser light for readout is irradiated into the medium, the laser light irradiated therein is diffracted by signals recorded in its hologram recording material layer, and then, the laser light is reflected on its reflective film, and the reflected laser light is converted to electric signals by means of an image sensor. In other words, in the reflected light reproducing type medium, the laser light to be detected is reflected toward the same medium side as the medium side into which the reproducing laser light is irradiated. The reflected light reproducing type medium usually has a structure wherein the recording material layer is formed on a supporting substrate positioned at the medium side into which the reproducing laser light is irradiated; and a reflective film and an another supporting substrate are formed on the recording material layer. In an optical system used for the medium, the image sensor, for detecting the reflected laser light, is set up in the same medium side as the medium side into which the reproducing laser light emitted from a light source is irradiated.

Accordingly, in the reflected light reproducing type medium, the supporting substrate positioned at the medium surface side into which the reproducing laser light is irradiated, the recording material layer, and other optional layer(s) positioned nearer to the medium side into which the reproducing laser light is irradiated than the reflective film are each made of a light-transmitting material. It is unallowable that these members each substantially contain an element blocking the incident or reflective reproducing laser light. The supporting substrate is usually a rigid substrate made of glass or resin. The supporting substrate positioned at the medium surface side into which the reproducing laser light is irradiated is required to have a light-transmitting property.

In any case of the transmitted light reproducing type medium and the reflected light reproducing type medium, it is important that the hologram recording material layer has a high light transmittance of, for example, 50% or more at a wavelength of 405 nm. For example, in the case of considering a layer (100 μm in thickness) composed only of the matrix material (metal oxide material), it is preferred that the layer has a high light transmittance of 90% or more at a wavelength of 405 nm.

In the hologram recording medium of the present invention, the hologram recording material layer is a layer made of a hologram recording material composition containing as essential components thereof: a metal oxide (which preferably contains an organic group), wherein a metal of the metal oxide is selected from Si, Ta, Zr, Ti, Ge, Sn, Al, Zn and the like; and a photopolymerizable compound. When the hologram recording material layer contains as constituent elements two or more out of such metals, the refractive index of the recording material and other characteristics thereof are easily controlled. Thus, this case is preferred for the design of the recording material.

The metal oxide is obtained by subjecting an alkoxide compound of the corresponding one or more kinds of metals to hydrolysis and polymerization reaction (the so-called sol-gel reaction). The metal oxide is in a gel form or a sol form. The metal oxide functions as a matrix or a dispersing medium for the photopolymerizable compound in the hologram recording material layer. That is, the photopolymerizable compound in a liquid phase is evenly dispersed with good compatibility in the metal oxide in a gel- or sol-form.

When light having coherency is irradiated onto the hologram recording material layer, the photopolymerizable organic compound (monomer) undergoes polymerization reaction in the exposed portion so as to be polymerized, and further the photopolymerizable organic compound diffuses and shifts from the unexposed portion into the exposed portion so that the polymerization of the exposed portion further advances. As a result, an area where the polymer produced from the photopolymerizable organic compound is large in amount and an area where the polymer is small in amount are formed in accordance with the intensity distribution of the light. At this time, the metal oxide shifts from the area where the polymer is large in amount to the area where the polymer is small in amount, so that the area where the polymer is large in amount becomes an area where the metal oxide is small in amount and the area where the polymer is small in amount becomes an area where the metal oxide is large in amount. In this way, the light exposure causes the formation of the area where the polymer is large in amount and the area where the metal oxide is large in amount. When a refractive index difference exists between the polymer and the metal oxide, a refractive index change is recorded in accordance with the light intensity distribution.

In order to obtain a better recording property in the hologram recording material, it is necessary that a difference is large between the refractive index of the polymer produced from the photopolymerizable compound and that of the metal oxide. The refractive indexes of the polymer and the metal oxide may be designed so as to make any one of the refractive indexes high (or low).

In the design of the hologram recording material, it is preferred to use Si at a relatively large content when the refractive index of the metal oxide is made lower than that of the polymer produced from the photopolymerizable compound. On the other hand, when the refractive index of the metal oxide is made higher than that of the polymer produced from the photopolymerizable compound, it is preferred to use Ti, Ta, Zr or the like at a relatively large content.

Among Ti, Ta and Zr, Ti is a preferred constituent element of the metal oxide from the viewpoint that Ti can realize a high refractive index of the metal oxide. On the other hand, Ti has a drawback that Ti easily absorbs light having a wavelength in the blue wavelength region. Specifically, when the metal oxide absorbs light having a wavelength in the blue wavelength region, the light transmittance of a hologram recording medium using such a hologram recording material layer lowers in holographic memory record using a blue laser.

Ta and Zr each have a smaller refractive index than Ti, but have an advantage of having a high transmittance to light having a wavelength in the blue wavelength region. Thus, in order to obtain the hologram recording medium of the present invention, a preferred hologram recording material layer is made of a hologram recording material composition containing, as essential components thereof: an organic group-containing metal oxide comprising, as metals, Si and at least one selected from the group consisting of Ta and Zr, wherein a complexing ligand coordinated to Ta and/or Zr; and a photopolymerizable compound. The hologram recording material is made into a film form, thereby preparing the hologram recording material layer. Any optional metal other than Si, Ta and Zr may be further used. In this embodiment, however, it is preferred not to use Ti.

In the metal oxide, the number of Si atoms, that of Ta atoms and Zr atoms should be appropriately determined, considering a desired refractive index. For example, the number (s) of the Si atoms, and the number (m) of the Ta atoms and/or Zr atoms, and any other optional metal atoms (such as Ge, Sn, Al and Zn) preferably satisfy the following relationship:

$$0.3\ s \leq m \leq 3\ s.$$

The organic group-containing metal oxide is obtained by subjecting an alkoxide compound of Ta and/or an alkoxide compound of Zr which is/are modified with a complexing ligand and the corresponding alkoxide compound of Si to hydrolysis and polymerization reaction (the so-called sol-gel reaction). The metal oxide is in a very even gel or sol form. The photopolymerizable compound in a liquid phase is evenly dispersed with a good compatibility in the organic group-containing metal oxide in a gel- or sol-form.

In the present invention, a complexing ligand is coordinated to at least one portion of Ta and/or Zr, which constitute(s) the metal oxide. The complexing ligand may be the so-called chelate ligand, and examples thereof include β-dicarbonyl compounds, polyhydroxylated ligands, and α- or β-hydroxy acids. Examples of the β-dicarbonyl compounds include β-diketones such as acetylacetone (AcAc) and benzoylacetone; and β-ketoesters such as ethyl acetoacetate (EtAcAc). Examples of the α- or β-hydroxy acids include lactic acid, glyceric acid, tartaric acid, citric acid, tropic acid, and benzilic acid. Other examples of the ligand include oxalic acid.

When a mixture of the alkoxide compound of Ta and/or the alkoxide compound of Zr, and the alkoxide compound of Si is subjected to a sol-gel reaction, the alkoxide compound of Si is generally small in speeds of the hydrolysis and polymerization reaction and the alkoxide compound of Ta and the alkoxide compound of Zr are large in speeds of the hydrolysis and polymerization reaction. As a result, an oxide or oxides of Ta and/or Zr aggregate(s) so that a homogeneous sol-gel reaction product cannot be obtained. The present inventors have investigated, so as to find out that in the case of coordinating a complexing ligand to an alkoxide compound of Ta and/or an alkoxide compound of Zr to modify the compound(s) chemically, the hydrolysis and polymerization reaction thereof can be retarded so that a homogeneous sol-gel reaction product can be obtained from a mixture thereof with an alkoxide compound of Si. It appears that the hydrolysis and polymerization reaction are retarded by a matter that the complexing ligand is coordinated to the alkoxide compound of Zr, i.e., $Zr(OR)_4$ wherein R represents an alkyl group to change the alkoxide compound to an alkoxide compound such as $Zr(OR)_2(AcAc)_2$ so that the number of alkoxy groups which can contribute to the hydrolysis and polymerization reaction decreases; and a matter that the reactivity of the alkoxy groups is retarded by a steric factor of the complexing ligand such as acetylacetone (AcAc). The same matter would be true for the alkoxide compound of Ta, i.e., $Ta(OR)_5$. As described above, the organic group-containing metal oxide in the present invention is in a very even gel or sol form. The organic group-containing metal oxide less absorbs light having a wavelength in the blue wavelength region than oxides containing Ti as a constituent metal element thereof.

The amount of the used complexing ligand is not particularly limited. It is advisable to determine appropriately the amount of the complexing ligand based on the amount of the Ta alkoxide compound or that of the Zr alkoxide compound, considering the above-mentioned reaction retarding effect. In the case of, for example, a bidentate ligand such as a β-dicarbonyl compound, it is advisable to use 1.5 to 2 moles of the β-dicarbonyl compound per one mole of the Ta alkoxide compound, or use 1 to 2 moles of the β-dicarbonyl compound per one mole of the Zr alkoxide compound, and when using both of the Ta alkoxide compound and the Zr alkoxide compound, it is advisable to use 1 to 2 moles of the β-dicarbonyl compound per one mole of the total of the two.

In the organic group-containing metal oxide, the metal atoms (the same metal atoms and the different metal atoms) are bonded to each other through an oxygen atom interposed therebetween. Any optional metal other than Si, Ta and Zr may be selected arbitrarily from, for example, the group consisting of Ge, Sn, Al and Zn.

In the present invention, a preferred organic group-containing metal oxide which has flexibility will be described hereinafter.

In the present invention, in order to obtain a much better recording property in the hologram recording material, it is necessary that the diffusion/polymerization of the photopolymerizable compound is easily attained in the state that the photopolymerizable compound is present together with the organic group-containing metal oxide. If the organic group-containing metal oxide has flexibility, it functions as a matrix or a dispersing medium for the photopolymerizable compound so that the diffusion/polymerization of the photopolymerizable compound is easily attained. Thus, the refractive index change between the exposed portion and the unexposed portion becomes larger by irradiation of light.

In the present invention, the preferred organic group-containing metal oxide contains, as metals (M), Si and at least one selected from the group consisting of Ta and Zr, contains a complexing ligand coordinated to Ta and/or Zr, and further contains an organometallic unit (Ar—Si—Ar), wherein two aromatic groups (Ar) are directly bonded to Si. Alternatively, the metal oxide may further contain, as metals (M), any optional metal other than Si, Ta and Zr (provided that Ti is not contained), and further contains an organometallic unit (Ar-M-Ar), wherein two aromatic groups (Ar) are directly bonded to the optional metal (M). The metal oxide having such an organometallic unit has flexibility.

In order to introduce the organometallic unit (Ar-M-Ar) into the metal oxide, it is advisable to use a diarylalkoxide compound of the metal (M), which constitutes the organometallic unit, in the sol-gel reaction.

The diarylalkoxide compound of Si as a raw material is available at ease. However, it is not excluded that aromatic groups are bonded directly to the metal other than Si.

It is more preferred that the organometallic unit (Ar—Si—Ar) is a unit (Ph-Si-Ph) wherein two phenyl groups (Ph) are bonded directly to one Si atom. The diphenylalkoxide compound of Si as a raw material is available at ease, and the compound is good in reactivity for hydrolysis and polymerization. The phenyl groups may have a substituent.

The preferred organic group-containing metal oxide has an organometallic unit wherein two aromatic groups are bonded directly to one metal. Besides the organometallic unit, the organometallic compound may have an organometallic unit wherein one aromatic group is bonded directly to one metal, or may have an organometallic unit wherein three aromatic groups are bonded directly to one metal.

According to the introduction of the two aromatic groups (phenyl groups) into Si, the organometallic compound has good compatibility with the photopolymerizable compound described below and an organic polymer produced by the polymerization thereof. The refractive index of the organic group-containing metal oxide also becomes high.

In the present invention, it is preferred that the number (p) of the phenyl group, the number (s) of the Si atom, and the number (m) of the metals (Ta, and Zr) other than Si which are contained in the organic group-containing metal oxide satisfy the following relationship in the above-mentioned metal oxide composition:

$$s \leq p \leq 3s, \text{ and}$$

$$0.3s \leq m \leq 3s.$$

Specifically, it is preferred that one or more and less than three phenyl groups are bonded to one Si atom, as the whole of the metal oxide composition, from the viewpoint of the compatibility with the photopolymerizable compound and an organic polymer produced by the polymerization thereof. It is also preferred that the number (m) of the metals other than Si, such as Ta, and Zr, is within the above-mentioned range in relative to the number (s) of the Si atom. If the number (m) of the other metals is less than 0.3 s, the effects of the inclusion of the two or more kinds of metals into the metal oxide, that is, the effect that the characteristics, such as the refractive index, are easily controlled becomes small. On the other hand, if the number (m) of the other metals is more than 3 s, the metal oxide comes to have the nature of an inorganic matrix easily as the whole of the metal oxide so that the compatibility or flexibility falls.

In the present invention, an organic group other than the aromatic groups, for example, an alkyl group may be introduced into Si in the metal oxide. For example, methylphenyldimethoxysilane or the like can be used as long as the advantageous effects of the present invention are not damaged. When a monoalkoxysilane such as trimethylmethoxysilane is present, the polymerization reaction is terminated. Accordingly, the monoalkoxysilane can be used to adjust the molecular weight.

The metal oxide may contain trace amounts of elements other than the above.

Further, the present inventors have made eager investigations, so as to make use of an advantage of Ti that a high refractive index of the metal oxide can be realized. As a result, it has been found out that at the time of synthesizing an (organic group-containing) metal oxide which contains Ti and Si as constituent elements by subjecting alkoxide compounds of the corresponding metals (Ti and Si, and any other optional metals) to hydrolysis and polymerization reaction (the so-called sol-gel reaction), the absorption of blue light into the resultant metal oxide can be decreased by using an organic solvent which neither contains cyclic ether skeleton nor carbonyl oxygen as an organic solvent. In other words, it has been understood that the absorption of blue light into the metal oxide results from the organic group contained in the metal oxide and further a complex of Ti (or coordination of Ti) formed between the metal oxide and the organic solvent used for the sol-gel reaction.

Ether oxygen in cyclic ether skeleton and carbonyl oxygen are high in capability of coordinating to Ti. Accordingly, in the sol-gel reaction of an alkoxide compounds of Ti, dioxane, tetrahydrofuran, N-methylpyrrolidone, dimethylformamide, dimethylacetamide, acetylacetone or the like should not be used. Preferred examples of the organic solvent include monoalcohol, dialcohol, and monoalkyl ether of dialcohol. Specific examples thereof include monoalcohols such as methanol, ethanol, propanol, isopropanol, and butanol; dialcohols such as ethylene glycol, and propylene glycol; and monoalkyl ethers of dialcohols such as 1-methoxy-2-propanol, and ethylene glycol monomethyl ether (methyl cellosolve). Out of these, the solvent to be used may be appropriately selected. Alternatively, a mixed solvent of these solvents may be used, and water may be added thereto. These solvents are low in capability of coordinating to Ti. Alternatively, even if the solvents coordinate to Ti, no transition absorption band at a low energy level is generated. Accordingly, even if these solvents remain in the metal oxide, the absorption of blue light into the resultant metal oxide is decreased.

When the metal oxide which contains Ti and Si as the constituent elements thereof has an organometallic unit (Ar—Si—Ar) wherein two aromatic groups (Ar) are directly bonded to Si, the flexibility of the metal oxide is favorably improved in the same manner as in the above-mentioned metal oxide containing Si, and Ta and/or Zr as the constituent elements thereof.

In the metal oxide, the number of the Ti atoms, and that of the Si atoms should be appropriately determined, considering a desired refractive index. For example, the number (s) of the Si atoms, and the number (m) of the Ti atoms and any other optional metal atoms (such as Zr, Ge, Sn, Al and Zn) preferably satisfy the following relationship:

$$0.3\ s \leq m \leq 3\ s.$$

In the present invention, the photopolymerizable compound is a photopolymerizable monomer. As the photopolymerizable compound, a compound selected from a radical polymerizable compound and a cation polymerizable compound can be used.

The radical polymerizable compound is not particularly limited as long as the compound has in the molecule one or more radical polymerizable unsaturated double bonds. For example, a monofunctional and multifunctional compound having a (meth)acryloyl group or a vinyl group can be used. The wording "(meth)acryloyl group" is a wording for expressing a methacryloyl group and an acryloyl group collectively.

Examples of the compound having a (meth)acryloyl group, out of the radical polymerizable compounds, include monofunctional(meth)acrylates such as phenoxyethyl(meth)acrylate, 2-methoxyethyl(meth)acrylate, 2-hydroxyethyl(meth)acrylate, benzyl(meth)acrylate, cyclohexyl(meth)acrylate, ethoxydiethylene glycol(meth)acrylate, methoxypolyethylene glycol(meth)acrylate, methyl(meth)acrylate, polyethylene glycol(meth)acrylate, polypropylene glycol(meth)acrylate, and stearyl(meth)acrylate; and polyfunctional(meth)acrylates such as trimethylolpropane tri(meth)acrylate, pentaerythritol tetra(meth)acrylate, dipentaerythritol hexa(meth)acrylate, diethylene glycol di(meth)acrylate, triethylene glycol di(meth)acrylate, tetraethylene glycol di(meth)acrylate, polyethylene glycol di(meth)acrylate, bis(2-hydroxyethyl)isocyanurate di(meth)acrylate, and 2,2-bis[4-(acryloxy-diethoxy)phenyl]propane. However, the compound having a (meth)acryloyl group is not necessarily limited thereto.

Examples of the compound having a vinyl group include monofunctional vinyl compounds such as monovinylbenzene, and ethylene glycol monovinyl ether; and polyfunctional vinyl compounds such as divinylbenzene, ethylene glycol divinyl ether, diethylene glycol divinyl ether, and triethylene glycol divinyl ether. However, the compound having a vinyl group is not necessarily limited thereto.

One kind of the radical polymerizable compound may be used, and two or more kinds thereof are used together. In the case of making the refractive index of the metal oxide high and making the refractive index of the organic polymer low, in the present invention, a compound having no aromatic group to have low refractive index (for example, refractive index of 1.5 or less) is preferred out of the above-mentioned radical polymerizable compounds. In order to make the compatibility with the metal oxide better, preferred is a more hydrophilic glycol derivative such as polyethylene glycol (meth)acrylate and polyethylene glycol di(meth)acrylate.

The cation polymerizable compound is not particularly limited about the structure as long as the compound has at least one reactive group selected from a cyclic ether group and a vinyl ether group.

Examples of the compound having a cyclic ether group out of such cation polymerizable compounds include compounds having an epoxy group, an alicyclic epoxy group or an oxetanyl group.

Specific examples of the compound having an epoxy group include monofunctional epoxy compounds such as 1,2-epoxyhexadecane, and 2-ethylhexyldiglycol glycidyl ether; and polyfunctional epoxy compounds such as bisphenol A diglycidyl ether, novolak type epoxy resins, trisphenolmethane triglycidyl ether, 1,4-butanediol diglycidyl ether, 1,6-hexanediol diglycidyl ether, glycerin triglycidyl ether, trimethylolpropane triglycidyl ether, propylene glycol diglycidyl ether, and polyethylene glycol diglycidyl ether.

Specific examples of the compound having an alicyclic epoxy group include monofunctional compounds such as 1,2-epoxy-4-vinylcyclohexane, D-2,2,6-trimethyl-2,3-epoxybicyclo[3,1,1]heptane, and 3,4-epoxycyclohexylmethyl (meth)acrylate; and polyfunctional compounds such as 2,4-epoxycyclohexylmethyl-3,4-epoxycyclohexane carboxylate, bis(3,4-epoxycyclohexylmethyl) adipate, 2-(3,4-epoxycyclohexyl-5,5-spiro-3,4-epoxy)cyclohexanone-m-dioxane, bis(2,3-epoxycyclopentyl)ether, and EHPE-3150 (alicyclic epoxy resin, manufactured by Dicel Chemical Industries, Ltd.).

Specific examples of the compound having an oxetanyl group include monofunctional oxetanyl compounds such as 3-ethyl-3-hydroxymethyloxetane, 3-ethyl-3-(2-ethylhexyloxymethyl)oxetane, and 3-ethyl-3-(cyclohexyloxymethyl)oxetane; and polyfunctional oxetanyl compounds such as 1,4-bis[(3-ethyl-3-oxetanylmethoxy)methyl]benzene, 1,3-bis[(3-ethyl-3-oxetanylmethoxy)methyl]propane, ethylene glycol bis(3-ethyl-3-oxetanylmethyl)ether, trimethylolpropanetris(3-ethyl-3-oxetanylmethyl)ether, pentaerythritol tetrakis(3-ethyl-3-oxetanylmethyl)ether, dipentaerythritol hexakis(3-ethyl-3-oxetanylmethyl)ether, and ethylene oxide modified bisphenol A bis(3-ethyl-3-oxetanylmethyl)ether.

Specific examples of the compound having a vinyl ether group, out of the above-mentioned cation polymerizable compounds, include monofunctional compounds such as triethylene glycol monovinyl ether, cyclohexanedimethanol monovinyl ether, and 4-hydroxycyclohexyl vinyl ether; and polyfunctional compounds such as triethylene glycol divinyl ether, tetraethylene glycol divinyl ether, trimethylolpropane trivinyl ether, cyclohexane-1,4-dimethylol divinyl ether, 1,4-butanediol divinyl ether, polyester divinyl ether, and polyurethane polyvinyl ether.

One kind of the cation polymerizable compound may be used, or two or more kinds thereof may be used together. As the photopolymerizable compound, an oligomer of the cation polymerizable compounds exemplified above may be used. In the case of making the refractive index of the metal oxide high and making the refractive index of the organic polymer low, in the present invention, a compound having no aromatic group to have low refractive index (for example, refractive index of 1.5 or less) is preferred out of the above-mentioned cation polymerizable compounds. In order to make the compatibility with the metal oxide better, preferred is a more hydrophilic glycol derivative such as polyethylene glycol diglycidyl ether.

It is advisable that in the present invention the photopolymerizable compound is used, for example, in an amount of about 5 to 1,000% by weight of total of the metal oxide, preferably in an amount of 10 to 300% by weight thereof. If the amount is less than 5% by weight, a large refractive index change is not easily obtained at the time of recording. If the amount is more than 1,000% by weight, a large refractive index change is not easily obtained, either, at the time of recording.

In the present invention, it is preferred that the hologram recording material further contains a photopolymerization initiator corresponding to the wavelength of recording light. When the photopolymerization initiator is contained in the hologram recording material, the polymerization of the photopolymerizable compound is promoted by the light exposure at the time of recording. Consequently, a higher sensitivity is achieved.

When a radical polymerizable compound is used as the photopolymerizable compound, a photo radical initiator is used. On the other hand, when a cation polymerizable compound is used as the photopolymerizable compound, a photo cation initiator is used.

Examples of the photo radical initiator include Darocure 1173, Irgacure 784, Irgacure 651, Irgacure 184 and Irgacure 907 (each manufactured by Ciba Specialty Chemicals Inc.). The content of the photo radical initiator is, for example, about 0.1 to 10% by weight, preferably about 0.5 to 5% by weight on the basis of the radical polymerizable compound.

As the photo cation initiator, for example, an onium salt such as a diazonium salt, a sulfonium salt, or a iodonium salt can be used. It is particularly preferred to use an aromatic onium salt. Besides, an iron-arene complex such as a ferrocene derivative, an arylsilanol-aluminum complex, or the like can be preferably used. It is advisable to select an appropriate initiator from these. Specific examples of the photo cation initiator include Cyracure UVI-6970, Cyracure UVI-6974 and Cyracure UVI-6990 (each manufactured by Dow Chemical Co. in USA), Irgacure 264 and Irgacure 250 (each manufactured by Ciba Specialty Chemicals Inc.), and CIT-1682 (manufactured by Nippon Soda Co., Ltd.). The content of the photo cation initiator is, for example, about 0.1 to 10% by weight, preferably about 0.5 to 5% by weight on the basis of the cation polymerizable compound.

The hologram recording material composition preferably contains a dye that functions as a photosensitizer corresponding to the wavelength of recording light or the like besides the photopolymerization initiator. Examples of the photosensitizer include thioxanthones such as thioxanthen-9-one, and 2,4-diethyl-9H-thioxanthen-9-one; xanthenes; cyanines; melocyanines; thiazines; acridines; anthraquinones; and squaliriums. It is advisable to set a amount to be used of the photosensitizer into the range of about 5 to about 50% by weight of the radical photoinitiator, for example, about 10% by weight thereof.

A process for producing the hologram recording material layer will be described in the following.

In the case of using a metal oxide containing Si, and Ta and/or Zr as the constituent elements thereof, a hologram recording material, the production process of which is not particularly limited, is preferably produced by a production process comprising the steps of:

mixing an alkoxide compound of Ta and/or an alkoxide compound of Zr with the complexing ligand, thereby modifying the alkoxide compound of Ta and/or the alkoxide compound of Zr with the complexing ligand, mixing the alkoxide compound of Ta and/or the alkoxide compound of Zr, which is/are modified with a complexing ligand, with an alkoxide compound of Si, hydrolyzing the mixed alkoxide compounds to yield a precursor of a metal oxide, incorporating a photopolymerizable compound into the metal oxide precursor before, during or after the hydrolysis; and advancing a polycondensation reaction of the metal oxide precursor into which the photopolymerizable compound is incorporated.

First, an alkoxide compound of Ta or an alkoxide compound of Zr is mixed with a complexing ligand to modify the alkoxide compound of Ta or the alkoxide compound of Zr with the complexing ligand. In the case of using both of the alkoxide compound of Ta and the alkoxide compound of Zr, the alkoxide compounds may be separately modified with the complexing ligand or the alkoxide compounds may be modified therewith in a state that the compounds are mixed with each other. It is advisable to determine the amount of the complexing ligand appropriately, considering the above-mentioned reaction retarding effect. The solvent used at this time may be the same solvent as used in the sol-gel reaction.

Next, an alkoxide compound of Si is mixed with the alkoxide compound of Ta and/or the alkoxide compound of Zr, the reactivity of which is retarded by the modification with the complexing ligand. The alkoxide compound of Si is preferably a diarylalkoxide compound of Si.

Next, the mixed alkoxide compounds are hydrolyzed and polycondensed to yield a precursor of a metal oxide. The hydrolysis and polycondensation reaction can be carried out by the same operation under the same conditions as in known sol-gel methods. For example, the metal alkoxide compounds (the diphenylalkoxide compound of Si, and the modified alkoxide compound of Ta and/or the modified alkoxide compound of Zr) as the starting materials in a predetermined ratio are dissolved into an appropriate good solvent to prepare a homogeneous solution. An appropriate acid catalyst is dropwise added to the solution, and the solution is stirred in the presence of water, whereby the reaction can be conducted.

Examples of such a solvent include: water; alcohols such as methanol, ethanol, propanol, isopropanol, and butanol; ethers such as diethyl ether, dioxane, dimethoxyethane and tetrahydrofuran; and N-methylpyrrolidone, acetonitrile, dimethylformamide, dimethylacetoamide, dimethylsulfoxide, acetone, benzene, and the like. The solvent may be appropriately selected from these. Alternatively, a mixture of these may be used. The amount of the solvent is not limited, and is preferably 10 to 1,000 parts by weight with respect to 100 parts by weight of the whole of the metal alkoxide compound.

Examples of the acid catalyst include: inorganic acids such as hydrochloric acid, sulfuric acid, nitric acid and phosphoric acid; organic acids such as formic acid, acetic acid, trichloroacetic acid, trifluoroacetic acid, propionic acid, methanesulfonic acid, ethanesulfonic acid, and p-toluenesulfonic acid; and the like.

The hydrolysis polymerization reaction can be generally conducted at room temperature, which depends on the reactivity of the metal alkoxide compounds. The reaction can be conducted at a temperature of about 0 to 150° C., preferably at a temperature of about room temperature to 50° C. The reaction time may be appropriately determined, correspondingly to the relationship with the reaction temperature. The time is about 0.1 to 240 hours. The reaction may be conducted in an inert atmosphere such as nitrogen gas, or may be conducted under a reduced pressure of about 0.5 to 1 atom while the alcohol produced by the polymerization reaction is removed.

Before, during or after the hydrolysis, the photopolymerizable organic compound is mixed. The photopolymerizable organic compound may be mixed with the metal alkoxide compounds as the starting materials after, during or before the hydrolysis. In the case of the mixing after the hydrolysis, it is preferred to add and mix the photopolymerizable organic compound in the state that the sol-gel reaction system containing the metal oxide and/or the metal oxide precursor is sol in order to perform the mixing uniformly. The mixing of a photopolymerization initiator or photosensitizer can also be conducted before, during or after the hydrolysis.

A polycondensation reaction of the metal oxide precursor with which the photopolymerizable compound is mixed is advanced to yield a target hologram recording material made of a composition of the organic group-containing metal oxide. This composition contains the metal oxides that have various molecular weights.

In this process, the reactivity of the alkoxide compound of Ta and/or the alkoxide compound of Zr is retarded by modifying the compound(s) with the complexing ligand; therefore, the organic group-containing metal oxide is obtained in a very even gel- or sol-form.

In order to yield a hologram recording material layer, a hologram recording material solution in which the photopolymerizable organic compound and the sol-form organic group-containing metal oxide are uniformly mixed with each other is applied onto a substrate, and then the solvent is dried. As the case may be, the sol-gel reaction is further advanced. As a result, a hologram recording material layer in a film form is yielded. In such a way, the hologram recording material layer is produced wherein the photopolymerizable organic compound is uniformly contained in the organic group-containing metal oxide.

Further, in the case of using a metal oxide containing Si and Ti as the constituent elements thereof, for example, a diphenylalkoxide compound of Si and an alkoxide compound of Ti are used as starting materials, and both of the starting materials are subjected to hydrolysis and polymerization reaction to yield a composition of the metal oxide containing Si and Ti as constituting metals, including diphenylsilane units, and having various molecular weights.

The hydrolysis and polymerization reaction can be carried out according to almost the same operations and conditions as in known sol-gel processes. For example, the metal alkoxide compounds (the diphenylalkoxide compound of Si and the alkoxide compound of Ti), as the starting materials, the ratio therebetween being the determined ratio, are dissolved into a preferred organic solvent as above described to prepare a homogeneous solution. An appropriate acid catalyst is dropped into the solution. The solution is stirred in the presence of water, whereby the reaction can be conducted. The amount of the solvent is not limited, and is preferably 10 to 1,000 parts by weight with respect to 100 parts by weight of the whole of the metal alkoxide compound.

The hologram recording material layer obtained as above-mentioned has a high transmittance to a blue laser. Therefore, even if a thickness of the recording material layer is set to 100 μm, a recording medium having a light transmittance of 50% or more, preferably 55% or more at a wavelength of 405 nm is obtained when the medium is a transmitted light reproducing type medium; or a recording medium having a light reflectance of 25% or more, preferably 27.5% or more at a wavelength of 405 nm is obtained when the medium is a reflected light reproducing type medium. In order to attain holographic memory recording characteristics such that a high multiplicity is ensured, necessary is a recording material layer having a thickness of 100 μm or more, preferably 200 μm or more. According to the present invention, however, even if the thickness of the recording material layer is set to, for example, 1 mm, it is possible to ensure a light transmittance of 50% or more at a wavelength of 405 nm (when the medium is a transmitted light reproducing type medium), or a light reflectance of 25% or more at a wavelength of 405 nm (when the medium is a reflected light reproducing type medium).

When the above described hologram recording material layer is used, a hologram recording medium having a recording layer thickness of 100 μm or more, which is suitable for data storage, can be obtained. The hologram recording medium can be produced by forming the hologram recording material in a film form onto a substrate, or sandwiching the hologram recording material in a film form between substrates.

In a transmitted light reproducing type medium, it is preferred to use, for the substrate(s), a material transparent to a recording/reproducing wavelength, such as glass or resin. It is preferred to form an anti-reflection film against the recording/reproducing wavelength for preventing noises or give address signals and so on, onto the substrate surface at the side opposite to the layer of the hologram recording material. In order to prevent interface reflection, which results in noises, it is preferred that the refractive index of the hologram recording material and that of the substrate are substantially equal to each other. It is allowable to form, between the hologram recording material layer and the substrate, a refractive index adjusting layer comprising a resin material or oil material having a refractive index substantially equal to that of the recording material or the substrate. In order to keep the thickness of the hologram recording material layer between the substrates, a spacer suitable for the thickness between the substrates may be arranged. End faces of the recording material medium are preferably subjected to treatment for sealing the recording material.

About the reflected light reproducing type medium, it is preferred that the substrate positioned at the medium surface side into which a reproducing laser light is irradiated is made of a material transparent to a recording and reproducing wavelength, such as glass or resin. As the substrate positioned at the medium surface side opposite to the medium surface side into which a reproducing laser light is irradiated, a substrate having thereon a reflective film is used. Specifically, a reflective film made of, for example, Al, Ag, Au or an alloy made mainly of these metals and the like is formed on a surface of a rigid substrate (which is not required to have a light-transmitting property), such as glass or resin, by vapor deposition, sputtering, ion plating, or any other film-forming method, whereby a substrate having thereon the reflective film is obtained. A hologram recording material layer is provided so as to have a predetermined thickness on the surface of the reflective film of this substrate, and further a light-transmitting substrate is caused to adhere onto the surface of this recording material layer. An adhesive layer, a flattening layer and the like may be provided between the hologram recording material layer and the reflective film, and/or between the hologram recording material layer and the light-transmitting substrate. It is also unallowable that these optional layers hinder the transmission of the laser light. Others than this matter are the same as in the above-mentioned transmitted light reproducing type medium.

The hologram recording medium made of a single layer, which is the hologram recording material layer, without having any supporting substrate may be obtained, for example, by forming the hologram recording material layer onto a substrate by application, and then peeling off the hologram recording material layer from the substrate. In this case, the hologram recording material layer is, for example, a layer having a thickness in the order of millimeters. The substrate used in this case may be a substrate made of glass, resin or the like. The surface of the substrate may be subjected to a peeling treatment in advance.

In the transmitted light reproducing type medium which does not have any supporting substrate, for example, anti-reflection films are formed on both surfaces of the hologram recording material layer. The anti-reflection films may be formed by depositing a mono-layered or multi-layered dielectric film onto each of the surfaces of the hologram recording material layer by vapor-deposition, sputtering or the like. The material of the anti-reflection films is, for example, MgF in the case of the mono-layered film, and for example, a bi-layered film of $SiO_2/TiO_2$ may be used as the materials in the case of the multi-layered film.

In the reflected light reproducing type medium which does not have any supporting substrate, for example, an anti-reflection film is formed on the surface of the hologram recording material layer into which a reproducing laser light is irradiated, and a reflective film is formed on the other surface of the hologram recording material layer. The anti-reflection film may be formed in the same manner as described above. The reflective film may be formed by depositing a metal film on the other surface of the hologram recording material layer by vapor deposition, sputtering or the like. The material of the reflective film may be appropriately selected from Al, Ag, Au and others.

According to the hologram recording medium of the present invention, the recording material layer is uniform; thus, a problem of light scattering is not caused. Further, at the time of recording, the photopolymerizable organic compound is turned into a polymer in the exposed portion; the preferred metal oxide has the organometallic unit, wherein two aromatic groups are bonded directly to one metal, so that the metal oxide is very good compatible with the polymer. Therefore, according to the hologram recording medium of the present invention, the compatibility is sufficiently kept and problems of light scattering and a fall in the transmittance are not caused when or after recording is performed.

Accordingly, the hologram recording medium of the present invention is suitable for a system wherein record/reproduction are made using a laser light having a wavelength of 350 to 450 nm.

EXAMPLES

The present invention will be specifically described by way of the following examples; however, the invention is not limited to the examples.

Example 1

(Synthesis of a Matrix Material)

10.85 g of pentaethoxytantalum ($Ta(OEt)_5$, manufactured by Kojundo Chemical Lab. Co., Ltd.) and 5.21 g of ethyl acetoacetate (EtAcAc) were mixed with each other in 2.5 mL of an ethanol solvent at a room temperature, and then the mixture was stirred for 10 minutes. The ratio by mole of $Ta(OEt)_5$/EtAcAc was 1/1.5. To this reaction mixture was added 6.5 g of diphenyldimethoxysilane to prepare a metal alkoxide solution. The ratio by mole of Ta/Si was 1/1.

A solution composed of 0.75 mL of water, 0.3 mL of a 2 N aqueous solution of hydrochloric acid, and 2.5 mL of tetrahydrofuran (THF) was dropwise added to the metal alkoxide solution at a room temperature with stirring. The stirring was continued for 1 hour to conduct a hydrolysis reaction. In this manner, a sol solution containing Ta, Si and phenyl groups at a ratio by mole of Ta/Si/the phenyl groups of 1/1/2 was obtained.

(Photopolymerizable Compound)

To 100 parts by weight of polyethylene glycol diacrylate (M-245, manufactured by Toagosei Co., Ltd.) as a photopolymerizable compound were added 3 parts by weight of a photopolymerization initiator (IRG-907, manufactured by Ciba Specialty Chemicals K.K.) and 0.3 part by weight of 2,4-diethyl-9H-thioxanthen-9-one as a photosensitizer to prepare a mixture containing the photopolymerizable compound.

(Hologram Recording Material)

The sol solution and the mixture containing the photopolymerizable compound were mixed with each other at a room temperature to set the ratio of the matrix material (as a non-volatile component) and that of the photopolymerizable compound to 67 parts by weight and 33 parts by weight, respectively. Furthermore, the sol-gel reaction was sufficiently advanced for 1 hour in a state that light was shielded from the system, so as to yield a hologram recording material solution.

The resultant hologram recording material solution was applied onto a glass substrate and then dried to prepare a recording medium sample, as will be detailed below.

With reference to FIG. 1, which schematically illustrates a cross section of a hologram recording medium, explanation will be described.

A glass substrate (22) having a thickness of 1 mm and having one surface on which an anti-reflection film (22a) was formed was prepared. A spacer (24) having a predetermined thickness was put on a surface of the glass substrate (22) on which the anti-reflection film (22a) was not formed, and the hologram recording material solution obtained was applied onto the surface of the glass substrate (22). The resultant was dried at a room temperature for 1 hour, and then dried at 40° C. for 24 hours to volatilize the solvent. Through this drying step, the gelation (condensation reaction) of the organic group-containing metal oxide was advanced so as to yield a hologram recording material layer (21) having a dry film thickness of 300 μm wherein the organic group-containing metal oxide and the photopolymerizable compound were uniformly dispersed.

(Hologram Recording Medium)

The hologram recording material layer (21) formed on the glass substrate (22) was covered with another glass substrate (23) having a thickness of 1 mm and having one surface on which an anti-reflection film (23a) was formed. At this time, the covering was carried out in such a manner that a surface of the glass substrate (23) on which the anti-reflection film (23a) was not formed would contact the surface of the hologram recording material layer (21). In this way, a hologram recording medium (11) was obtained which had a structure wherein the hologram recording material layer (21) was sandwiched between the two glass substrates (22) and (23).

(Evaluation of Characteristics)

Figure 2:
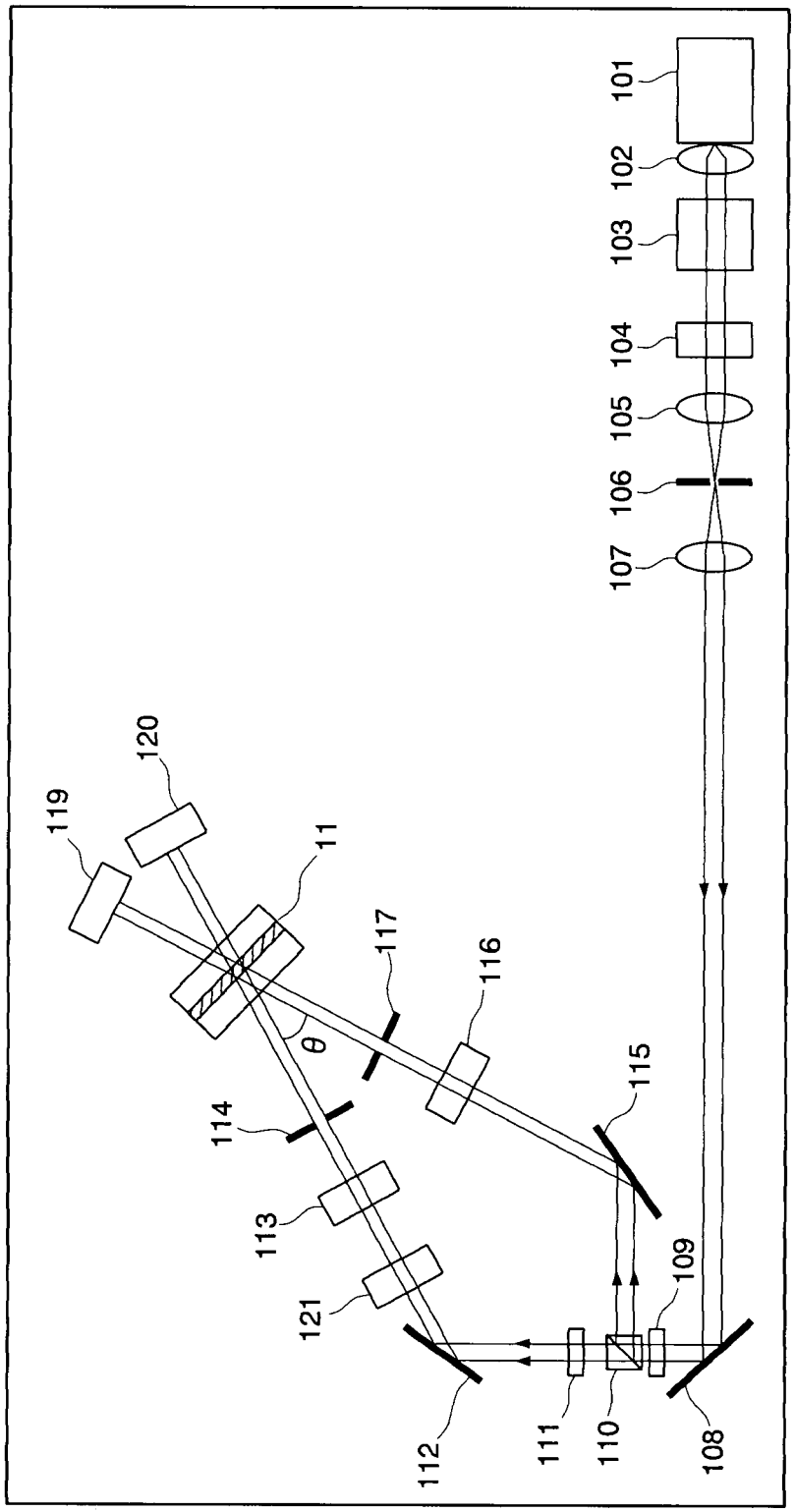
FIG. 2 is a plane view illustrating the outline of a hologram recording optical system used in the example.

About the resultant hologram recording material sample, characteristics thereof were evaluated in a hologram recording optical system as illustrated in FIG. 2. The direction along which the paper surface on which FIG. 2 is drawn stretches is defined as a horizontal direction for convenience' sake.

In FIG. 2, the hologram recording medium sample (11) was set to make the recording material layer perpendicular to the horizontal direction.

In the hologram recording optical system illustrated in FIG. 2, a light source (101) for emitting a semiconductor laser (wavelength: 405 nm) in a single mode oscillation was used. Light emitted from this light source (101) was subjected to a spatial filtrating treatment by means of a beam rectifier (102), a light isolator (103), a shutter (104), a convex lens (105), a pinhole (106), and a convex lens (107), so as to be collimated, thereby enlarging the light into a beam diameter of about 10 mmϕ. The enlarged beam was passed through a mirror (108) and a ½ wavelength plate (109) to take out 45° (45 degree) polarized light. The light was split into an S wave and a P wave (the ratio of S wave/P wave is 1/1) through a polarized beam splitter (110). The S wave obtained by the splitting was passed through a mirror (115), a polarizing filter (116), and an iris diaphragm (117) while a ½ wavelength plate (111) was used to convert the P wave obtained by the splitting to an S wave and then the S wave was passed through a mirror (112), a polarizing filter (113) and an iris diaphragm (114). In this way, the total incident angle θ of the two light fluxes irradiated into the hologram recording medium sample (11) was set to 37°, so as to record interference fringes of the two light fluxes in the sample (11).

The sample (11) was rotated in the horizontal direction to attain multiplexing (angle multiplexing; sample angle: −21° to +21°, angular interval: 3°) and further the sample (11) was rotated around an axis perpendicular to the surface of the sample 11 to attain multiplexing (peristrophic multiplexing; sample angle: 0 to 90°, angular interval: 10°), thereby recording a hologram. The multiplicity was 150. At the time of the recording, the sample was exposed to the light while the iris diaphragms (114) and (117) were each set into 4ϕ.

Details of this multiple recording will be described hereinafter. The sample (11) was rotated in the horizontal direction (around the axis perpendicular to the paper surface) from −21° to +21° at angular intervals of 30 to attain multiplexing. Thereafter, the sample (11) was rotated at 10° (i.e., 10° when it was viewed from the side into which the laser light was irradiated) around the axis perpendicular to the surface of the sample (11). The sample (11) was again rotated in the horizontal direction from −21° to +21° at angular intervals of 3° to attain multiplexing. This was repeated 10 times to rotate the sample (11) around the axis perpendicular to the surface of the sample (11) from 0° to 90°, thereby attaining multiple recording giving a multiplicity of 150.

A position where the angle of the surface of the sample (11) to a central line (not illustrated) for dividing the angle θ made by the two light fluxes into two equal parts was 90° was defined as a position where the angle in the horizontal rotation was ±0°. The axis perpendicular to the surface of the sample (11) is as follows: when the sample (11) is rectangular, the axis is a perpendicular axis passing at an intersection point of the two diagonal lines; and when the sample (11) is circular, the axis is a perpendicular axis passing at the center of the circle.

In order to react remaining unreacted components after the hologram recording, a sufficient quantity of light was irradiated by use of only one light fluxes. At the time of reproduction, with shading by the shutter (121), the iris diaphragm (117) was set into 3ϕ and only one light flux was irradiated. The sample (11) was continuously rotated into the horizontal direction from −23° to +23° and further rotated around the axis perpendicular to the surface of the sample (11) from 0° to 90° at angular intervals of 10°. In the individual angle positions, the diffraction efficiency was measured with a power meter (120). When a change in the volume (a recording shrinkage) or a change in the average refractive index of the recording material layer is not generated before and after the recording, the diffraction peak angle in the horizontal direction at the time of the recording is consistent with that at the time of the reproduction. Actually, however, a recording shrinkage or a change in the average refractive index is generated; therefore, the diffraction peak angle in the horizontal direction at the time of the reproduction is slightly different from the diffraction peak angle in the horizontal direction at the time of the recording. For this reason, at the time of the reproduction, the angle in the horizontal direction was continuously changed and then the diffraction efficiency was calculated from the peak intensity when a diffraction peak made its appearance. In FIG. 2, reference number (119) represents a power meter not used in this example.

At this time, a dynamic range M/# (the sum of the square roots of the diffraction efficiencies) was a high value of 8.3, which was a converted value corresponding to the case that the thickness of the hologram recording material layer was converted to 1 mm. A light transmittance of the medium (recording layer thickness: 300 μm) before the recording exposure to light (i.e., at the initial stage) was 57% at 405 nm. A fall in the light transmittance of the medium at 405 nm (i.e., the recording wavelength) after the recording was not observed.

At this time, a reduction ratio in the light transmittance on the basis of the glass substrates (22) and (23) each having the anti-reflection film was 0.6%. Specifically, with reference to FIG. 1, a laser light was irradiated into the sample (11) from the side of the substrate (22), so as to be transmitted toward the side of the substrate (23); in this case, 0.3% of the light was reflected on the interface between the air and the anti-reflection film (22a) by the presence of the anti-reflection film (22a), and 99.7% thereof was transmitted (absorption: 0%), and 0.3% of the transmitted light (that is, 99.7%) was reflected on the interface between the anti-reflection film (23a) of the substrate (23) and the air. As a result, 99.4% of the original laser light was transmitted.

The refractive index of the glass substrates (22) and (23) was substantially equal to that of the hologram recording material layer (21); therefore, reflection on the interface between the glass substrate (22) and the recording material layer (21) and reflection on the interface between the recording material layer (21) and the glass substrate (23) may be neglected.

Figure 3:
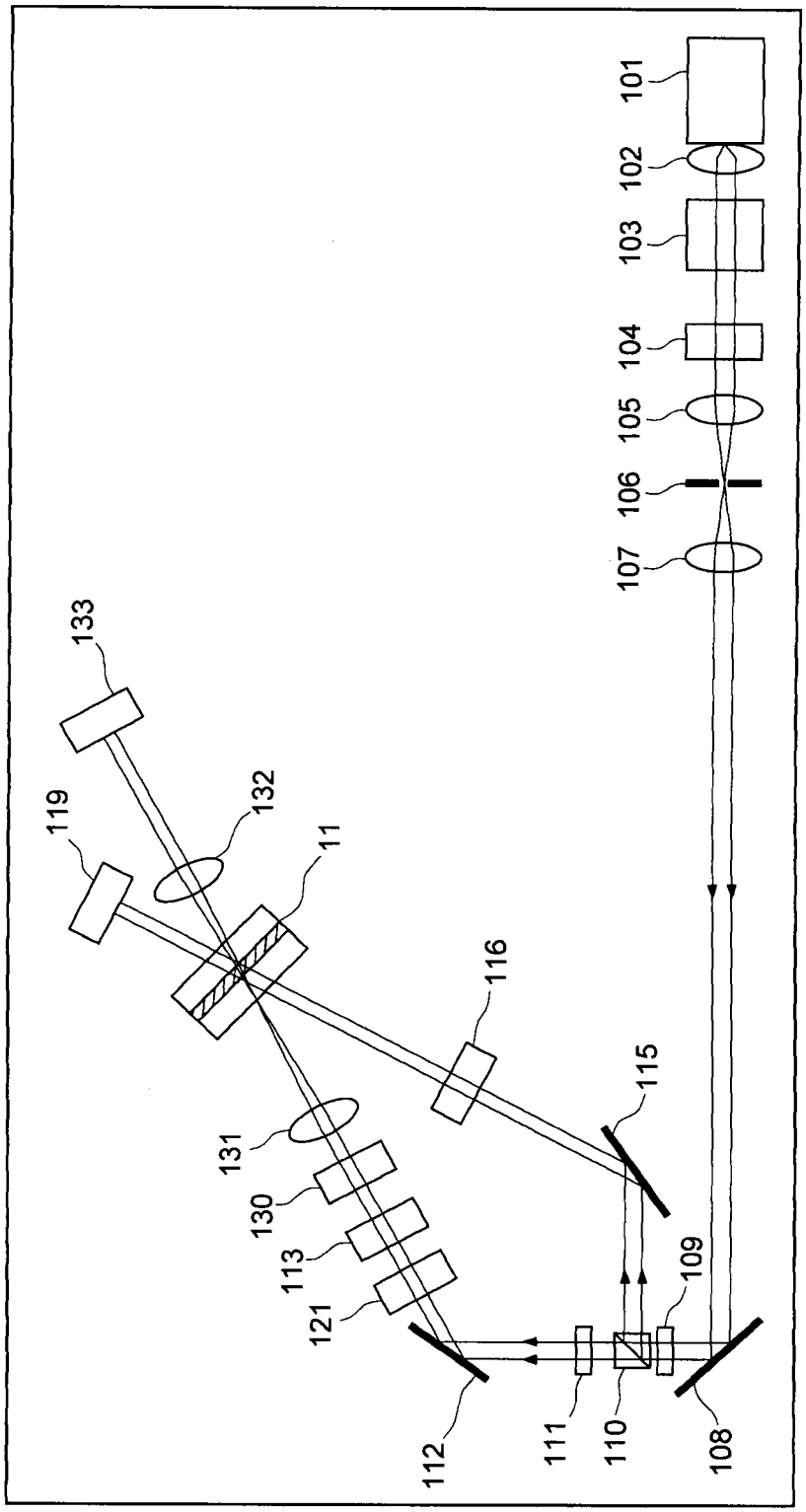
FIG. 3 is a plane view illustrating the outline of a hologram recording optical system for evaluating hologram images, which is used in the example.

Next, about the resultant hologram recording medium sample, hologram image thereof was evaluated in a hologram recording optical system as illustrated in FIG. 3. The direction along which the paper surface on which FIG. 3 is drawn stretches is defined as a horizontal direction for convenience' sake. The hologram recording optical system in FIG. 3 is partially different from that in FIG. 2. The same reference numbers are attached to the same members as in FIG. 2.

In FIG. 3, the hologram recording medium sample (11) was set to make the recording material layer perpendicular to the horizontal direction.

In the hologram recording optical system illustrated in FIG. 3, a light source (101) for emitting a semiconductor laser (wavelength: 405 nm) in a single mode oscillation was used. Light emitted from this light source (101) was subjected to a spatial filtrating treatment by means of a beam rectifier (102), a light isolator (103), a shutter (104), a convex lens (105), a pinhole (106), and a convex lens (107), so as to be collimated, thereby enlarging the light into a beam diameter of about 10 mmϕ. The enlarged beam was passed through a mirror (108) and a ½ wavelength plate (109) to take out 45° (45 degree) polarized light. The light was split into an S wave and a P wave (the ratio of S wave/P wave is 1/1) through a polarized beam splitter (110). The P wave (object light), i.e., light transmitted through the polarized beam splitter (110) was converted to an S wave by use of a ½ wavelength plate (111). The resultant S wave light was passed through a mirror (112), and a polarizing filter (113), and then optically modulated with a test pattern glass (130). The light was collected onto one of the surfaces of the medium sample (11) through a convex lens (a Fourier lens) (131), so as to be irradiated into the sample (11). Simultaneously, the light reflected on the polarized beam splitter (110) (reference light), i.e., the S wave was passed through a mirror (115) and a polarizing filter (116) so as to be irradiated into the sample (11). This irradiated reference light was interfered with the object light, thereby forming a hologram in the sample (11).

In the reproduction of the hologram, the object light was shielded with a shutter (121) so that only the reference light was irradiated into the sample (11). The resultant diffraction light was passed through a convex lens (132) so as to be focused onto a CCD camera (133), thereby forming an image. The image was then evaluated.

The test pattern glass (130), the convex lens (131), the medium sample (11) and the convex lens (132), and the CCD camera (133) were arranged to form a 4f optical system.

In the medium sample of Example 1, a good hologram image was obtained.

Example 2

A hologram recording material solution was yielded in the same manner as in Example 1 except that thioxanthen-9-one was used as a photosensitizer. The resultant hologram recording material solution was applied in the same manner as in Example 1 to yield a hologram recording material layer (21) having a dry thickness of 320 μm. A hologram recording medium (11) was obtained in this manner.

Characteristics thereof were evaluated in the same manner as in Example 1. As a result, a dynamic range M/# was a high value of 7.9, which was a converted value corresponding to the case that the thickness of the hologram recording material layer was converted to 1 mm.

A light transmittance of the medium (recording layer thickness: 320 μm) before the recording exposure to light (i.e., at the initial stage) was 60% at 405 nm. A fall in the light transmittance of the medium at 405 nm (i.e., the recording wavelength) after the recording was not observed.

Hologram image was evaluated in the same manner as in Example 1. As a result, a good hologram image was obtained in the medium sample of Example 2.

Example 3

(Synthesis of a Matrix Material)

8.2 g of tetra-t-butoxyzirconium ($Zr(O-tBu)_4$, manufactured by Kojundo Chemical Lab. Co., Ltd.) and 5.56 g of ethyl acetoacetate (EtAcAc) were mixed with each other in 2 mL of a n-butanol solvent at a room temperature, and then the mixture was stirred for 10 minutes. The ratio by mole of Zr (O-tBu) 4/EtAcAc was 1/2. To this reaction mixture was added 5.2 g of diphenyldimethoxysilane to prepare a metal alkoxide solution. The ratio by mole of Zr/Si was 1/1.

A solution composed of 0.6 mL of water, 0.24 mL of a 2 N aqueous solution of hydrochloric acid, and 2 mL of tetrahydrofuran was dropwise added to the metal alkoxide solution at a room temperature with stirring. The stirring was continued for 1 hour to conduct a hydrolysis reaction. In this manner, a sol solution containing Zr, Si and phenyl groups at a ratio by mole of Zr/Si/the phenyl groups of 1/1/2 was obtained.

(Photopolymerizable Compound)

To 100 parts by weight of polyethylene glycol diacrylate (M-245, manufactured by Toagosei Co., Ltd.) as a photopolymerizable compound were added 3 parts by weight of a photopolymerization initiator (IRG-907, manufactured by Ciba Specialty Chemicals K.K.) and 0.3 part by weight of 2,4-diethyl-9H-thioxanthen-9-one as a photosensitizer to prepare a mixture containing the photopolymerizable compound.

(Hologram Recording Material)

The sol solution and the mixture containing the photopolymerizable compound were mixed with each other at a room temperature to set the ratio of the matrix material (as a nonvolatile component) and that of the photopolymerizable compound to 67 parts by weight and 33 parts by weight, respectively. Furthermore, the sol-gel reaction was sufficiently advanced for 1 hour in a state that light was shielded from the system, so as to yield a hologram recording material solution.

The resultant hologram recording material solution was applied in the same manner as in Example 1 to yield a hologram recording material layer (21) having a dry thickness of 380 μm. A hologram recording medium (11) was obtained in this manner.

Characteristics thereof were evaluated in the same manner as in Example 1. As a result, a dynamic range M/# was a high value of 8.1, which was a converted value corresponding to the case that the thickness of the hologram recording material layer was converted to 1 mm.

A light transmittance of the medium (recording layer thickness: 380 μm) before the recording exposure to light (i.e., at the initial stage) was 61% at 405 nm. A fall in the light transmittance of the medium at 405 nm (i.e., the recording wavelength) after the recording was not observed.

Hologram image was evaluated in the same manner as in Example 1. As a result, a good hologram image was obtained in the medium sample of Example 3.

Comparative Example 1

In this Comparative Example, a Ti alkoxide compound (i.e., a decamer of titanium butoxide represented by the following structural formula) was used, without using both Ta alkoxide compound and Zr alkoxide compound.

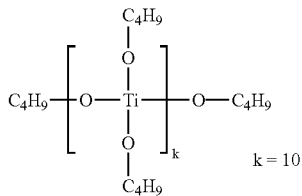

(Synthesis of a Matrix Material)

In 6 mL of a tetrahydrofuran solvent, 7.8 g of diphenyldimethoxysilane and 7.2 g of the titanium butoxide decamer (B-10, manufactured by Nippon Soda Co., Ltd.) were mixed with each other to prepare an alkoxide solution. Namely, the ratio by mole of Si/Ti was 1/1.

A solution composed of 0.9 mL of water, 0.36 mL of a 2 N aqueous solution of hydrochloric acid, and 3 mL of tetrahydrofuran was dropwise added to the alkoxide solution at a room temperature with stirring. The stirring was continued for 1 hour to conduct a hydrolysis reaction. In this manner, a sol solution containing Si, Ti and phenyl groups at a ratio by mole of Si/Ti/the phenyl groups of 1/1/2 was obtained.

(Photopolymerizable Compound)

To 100 parts by weight of polyethylene glycol diacrylate (M-245, manufactured by Toagosei Co., Ltd.) as a photopolymerizable compound were added 3 parts by weight of a photopolymerization initiator (IRG-907, manufactured by Ciba Specialty Chemicals K.K.) and 0.3 part by weight of thioxanthen-9-one as a photosensitizer to prepare a mixture containing the photopolymerizable compound.

(Hologram Recording Material Solution)

The sol solution and the mixture containing the photopolymerizable compound were mixed with each other at a room temperature to set the ratio of the matrix material (as a non-volatile component) and that of the photopolymerizable compound to 67 parts by weight and 33 parts by weight, respectively. Furthermore, the sol-gel reaction was sufficiently advanced for 1 hour in a state that light was shielded from the system, so as to yield a hologram recording material solution.

The resultant hologram recording material solution was applied in the same manner as in Example 1 to yield a hologram recording material layer (21) having a dry thickness of 390 μm. A hologram recording medium (11) was obtained in this manner.

Characteristics thereof were evaluated in the same manner as in Example 1. As a result, a dynamic range M/# was a high value of 11.4, which was a converted value corresponding to the case that the thickness of the hologram recording material layer was converted to 1 mm. However, a light transmittance of the medium (recording layer thickness: 390 μm) before the recording exposure to light (i.e., at the initial stage) was 31% at 405 nm. After the recording, the light transmittance of the medium at 405 nm (i.e., the recording wavelength) was a lowered value of 1%.

Hologram image was evaluated in the same manner as in Example 1. As a result, a good hologram image was not obtained in the medium sample of Comparative Example 1.

Example 4

In this example, a Ti alkoxide compound (i.e., a decamer of titanium butoxide represented by the above-illustrated structural formula) was used, and an appropriate solvent was used to conduct a sol-gel reaction.

(Synthesis of a Matrix Material)

In 40 mL of a solvent of 1-methoxy-2-propanol, 7.8 g of diphenyldimethoxysilane and 7.2 g of the titanium butoxide decamer (B-10, manufactured by Nippon Soda Co., Ltd.) were mixed to prepare a metal alkoxide solution. Namely, the ratio by mol of Si/Ti was 1/1.

A solution made of 2.1 mL of water, 0.3 mL of a 1 N aqueous solution of hydrochloric acid, and 5 mL of 1-methoxy-2-propanol was dropwise added to the metal alkoxide solution at a room temperature with stirring. The stirring was continued for 2 hours to conduct a hydrolysis reaction. In this way, a sol solution of an organometallic compound was obtained wherein the ratio by mol of Si/Ti/phenyl groups was 1/1/2.

(Photopolymerizable Compound)

To 100 parts by weight of polyethylene glycol diacrylate (M-245, manufactured by Toagosei Co., Ltd.) as a photopolymerizable compound were added 3 parts by weight of a photopolymerization initiator (IRG-907, manufactured by Ciba Specialty Chemicals K.K.) and 0.3 part by weight of thioxanthen-9-one as a photosensitizer to prepare a mixture containing the photopolymerizable compound.

(Hologram Recording Material Solution)

The sol solution and the mixture containing the photopolymerizable compound were mixed with each other at room temperature to set the ratio of the matrix material (as a non-volatile component) and that of the photopolymerizable compound to 67 parts by weight and 33 parts by weight, respectively, to obtain a hologram recording material solution substantially transparent and colorless.

The resultant hologram recording material solution was applied in the same manner as in Example 1 to yield a hologram recording material layer (21) having a dry film thickness of 400 μm. A hologram recording medium (11) was obtained in this manner.

Characteristics thereof were evaluated in the same manner as in Example 1. As a result, a dynamic range M/# was a high value of 17.8, which was a converted value corresponding to the case that the thickness of the hologram recording material layer was converted to 1 mm. A light transmittance of the medium (recording layer thickness: 400 μm) before the recording exposure to light (i.e., at the initial stage) was 71% at 405 nm. A fall in the light transmittance of the medium at 405 nm (i.e., the recording wavelength) after the recording was not observed.

Hologram image was evaluated in the same manner as in Example 1. As a result, a good hologram image was obtained in the medium sample of Example 4.

In Comparative Example 1, a transmittance before the recording exposure to light (i.e., at the initial stage) was 31%, and was lower than the transmittance of 71% in Example 4. After the recording, the transmittance was a lower value of 1% in Comparative Example 1. When the portions exposed to the light were observed with naked eyes after the recording, the transparency was declined and the portions were clouded. It is presumed that this result was based on the generation of phase separation between the matrix made of the metal oxide and the photopolymerizable compound. In other words, it appears that because of a low transmittance of the medium before the recording exposure to light, heat at the time of the exposure accumulated easily in the medium so that the diffusion of the monomer and the polymerization reaction thereof advanced in a state that the temperature of the recording layer was raised. For this reason, it can be considered that the size of the monomer-polymerized phase and that of the matrix phase became giant with ease so that the light was scattered and the cloudiness was generated.

The above-mentioned example is about the transmitted light reproducing type medium having a light transmittance of 50% or more at a wavelength of 405 nm; however, it is evident that by use of a similar hologram recording material layer, a reflected light reproducing type medium having a light reflectance of 25% or more at a wavelength of 405 nm can be also produced.

What is claimed is:

1. A hologram recording medium comprising at least a hologram recording material layer,
    wherein the hologram recording material layer comprises at least a non-photopolymerizable metal oxide and a photopolymerizable compound; and
    said hologram recording medium has a light transmittance such that at a thickness of 1 mm the light transmittance is 50% or more at a wavelength of 405 nm, or the hologram recording medium has a light reflectance of 25% or more at a wavelength of 405 nm,
    wherein the metal oxide is a matrix in which the photopolymerizable compound is dispersed,
    wherein the metal oxide comprises Si and at least one selected from the group consisting of Ta and Zr, wherein a complexing ligand is coordinated to the Ta and/or the Zr;
    wherein the composition of the hologram recording material is such that when coated at a thickness of 100 μm the light transmittance at 405 nm does not fall after recording exposure with light; and
    wherein the metal oxide has an organometallic unit in which two aromatic groups are directly bonded to Si.

2. The hologram recording medium according to claim 1, wherein the hologram recording material layer further comprises a photopolymerization initiator.

3. The hologram recording medium according to claim 1, wherein the hologram recording material layer has a thickness of at least 100 μm.

4. The hologram recording medium according to claim 1, wherein the complexing ligand is selected from the group consisting of β-dicarbonyl compounds, polyhydroxylated ligands, and α- or β-hydroxy acids.

5. The hologram recording medium according to claim 1, wherein record/reproduction of said hologram recording medium are made using a laser light having a wavelength of 350 to 450 nm.

6. The hologram recording medium according to claim 1, wherein the number(s) of the Si atom(s), and the total number (m) of metal atoms of Ta and Zr satisfy the following relationship:

$$0.3\,s \leq m \leq 3\,s.$$

7. The hologram recording medium according to claim 1, wherein the metal oxide is obtained by hydrolyzing and polymerizing pentaethoxytantalum and diphenyldimethoxysilane.

8. The hologram recording medium according to claim 1, wherein the metal oxide is obtained by hydrolyzing and polymerizing tetra-t-butoxyzirconium and diphenyldimethoxysilane.

9. The hologram recording medium according to claim 1, where the non-photopolymerizable metal oxide is a hydrolysis and polymerization product of at least one compound selected from the group consisting of an alkoxide compound of Ta and an alkoxide compound of Zr; and a diaryl dialkoxide compound of Si.

10. The hologram recording medium according to claim 1, wherein the non-photopolymerizable metal oxide consists essentially of a hydrolysis and polymerization product of at least one compound selected from the group consisting of an alkoxide compound of Ta and an alkoxide compound of Zr; an alkoxide compound of Ti; and a diaryl dialkoxide compound of Si.

11. A hologram recording medium comprising at least a hologram recording material layer,
    wherein the hologram recording material layer comprises at least a non-photopolymerizable metal oxide and a photopolymerizable compound; and
    said hologram recording medium has a light transmittance such that at a thickness of 1 mm the light transmittance is 50% or more at a wavelength of 405 nm, or the hologram recording medium has a light reflectance of 25% or more at a wavelength of 405 nm;
    wherein the metal oxide is a matrix in which the photopolymerizable compound is dispersed;
    wherein the metal oxide comprises Si and at least one selected from the group consisting of Ta and Zr, wherein a complexing ligand is coordinated to the Ta and/or the Zr;
    wherein the composition of the hologram recording material is such that when coated at a thickness of 100 μm the light transmittance at 405 nm does not fall after recording photopolymerization of the photopolymerizable compound; and
    wherein the metal oxide has an organometallic unit in which two aromatic groups are directly bonded to Si.

12. The hologram recording medium according to claim 11, wherein the hologram recording material layer further comprises a photopolymerization initiator.

13. The hologram recording medium according to claim 11, wherein the hologram recording material layer has a thickness of at least 100 μm.

14. The hologram recording medium according to claim 11, wherein the complexing ligand is selected from the group consisting of β-dicarbonyl compounds, polyhydroxylated ligands, and α- or β-hydroxy acids.

15. The hologram recording medium according to claim 11, wherein record/reproduction of said hologram recording medium are made using a laser light having a wavelength of 350 to 450 nm.

16. The hologram recording medium according to claim 11, wherein the number(s) of the Si atom(s), and the total number (m) of metal atoms of Ta and Zr satisfy the following relationship:

$$0.3\,s \leq m \leq 3\,s.$$

17. The hologram recording medium according to claim 11, wherein the metal oxide is obtained by hydrolyzing and polymerizing pentaethoxytantalum and diphenyldimethoxysilane.

18. The hologram recording medium according to claim 11, wherein the metal oxide is obtained by hydrolyzing and polymerizing tetra-t-butoxyzirconium and diphenyldimethoxysilane.

19. The hologram recording medium according to claim 11, where the non-photopolymerizable metal oxide is a hydrolysis and polymerization product of at least one compound selected from the group consisting of an alkoxide compound of Ta and an alkoxide compound of Zr; and a diaryl dialkoxide compound of Si.

20. The hologram recording medium according to claim 11, wherein the non-photopolymerizable metal oxide consists essentially of a hydrolysis and polymerization product of at least one compound selected from the group consisting of an alkoxide compound of Ta and an alkoxide compound of Zr; an alkoxide compound of Ti; and a diaryl dialkoxide compound of Si.

* * * * *